United States Patent
Liu et al.

(10) Patent No.: US 7,202,170 B2
(45) Date of Patent: Apr. 10, 2007

(54) METHOD OF IMPROVING ETCHING PROFILE OF FLOATING GATES FOR FLASH MEMORY DEVICES

(75) Inventors: Kuo-Chin Liu, Hualien Hsien (TW); Chung-Long Leu, Taipei (TW); Mei-Hou Ke, Hsinyin (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/760,995

(22) Filed: Jan. 20, 2004

(65) Prior Publication Data
US 2005/0158975 A1 Jul. 21, 2005

(51) Int. Cl.
*H01L 21/302* (2006.01)

(52) U.S. Cl. .................... 438/689; 438/706; 438/710; 438/719

(58) Field of Classification Search ................ 438/689, 438/706, 707–714, 719, 266, 257, 593–594
See application file for complete search history.

(56) References Cited

U.S. PATENT DOCUMENTS

| | | | | |
|---|---|---|---|---|
| 5,851,926 A | | 12/1998 | Kumar et al. | 438/714 |
| 6,124,927 A | * | 9/2000 | Zhong et al. | 356/311 |
| 6,235,214 B1 | | 5/2001 | Deshmukh et al. | 216/67 |
| 6,509,228 B1 | | 1/2003 | Sun et al. | 438/257 |
| 6,699,399 B1 | * | 3/2004 | Qian et al. | 216/67 |
| 2004/0074869 A1 | * | 4/2004 | Wang et al. | 216/63 |

* cited by examiner

*Primary Examiner*—Thanh Nguyen
(74) *Attorney, Agent, or Firm*—Thomas, Kayden, Horstemeyer & Risley

(57) ABSTRACT

A method of forming floating gates for flash memory devices. A plurality of substrates is provided, in which a film to be etched and an overlying masking pattern layer are provided overlying each substrate. Each of the films in a plasma chamber is etched in sequence using the masking pattern layer as an etch mask, a polymer layer being deposited over the inner wall of the plasma chamber during the etching. An intermediary cleaning process is performed in the plasma chamber between the etchings before the deposited polymer layer reaches such a degree as to induce lateral etching on the next film to be etched, thereby improving etching profile of the films.

21 Claims, 9 Drawing Sheets

METHOD OF IMPROVING ETCHING PROFILE OF FLOATING GATES FOR FLASH MEMORY DEVICES

BACKGROUND

The present invention relates to fabrication of flash memory devices, and particularly to a method of improving etching profile of floating gates for a flash memory.

Semiconductor memory devices are commonly available in various forms, such as EPROMS, EEPROMS, and flash memory devices. Currently, flash memory, such as a split gate flash memory is widely applied in large capacity non-volatile memory technology. Typically, the split gate flash memory comprises a polysilicon floating gate for charge storage and a polysilicon control gate to control the charge storage. The floating gate is usually disposed under the control gate. The control gate is connected to a word line, while the floating gate is not connected to other wires or components. The erase performance of a split gate flash memory is primarily determined by the tip portion of the floating gate and the thickness of the inter-poly oxide between the floating gate and the control gate. As is known in the art, the sharper the tip portion of the floating gate, the faster the erase speed of the memory cell. That is, the profile of the tip portion of the floating gate determines the speed at which electrons are transferred between the floating gate and the control gate of the split gate flash memory. Moreover, poor profile of the floating gate, for example, an undercut profile or a footing profile, may change the threshold voltage, resulting in undesired electrical properties. Accordingly, profile control is an important factor for flash memory fabrication.

In order to improve the etching profile of the floating gate, several methods are proposed. In U.S. Pat. No. 5,851,926, Kumar et al. provide a method for etching transistor gates using a hard mask, which employs an etch composition comprising $NF_3$, $CL_2$ and HBr for etching transistor gates to achieve profile control. Moreover, in U.S. Pat. No. 6,235,214, Deshmukh et al. provide a method of etching silicon using a gas mixture comprising fluorine and oxygen to etch a silicon substrate and control the etching profile. Moreover, in U.S. Pat. No. 6,509,228, Sun et al. provide a method of forming floating gates for flash memory, which employs two-step etching procedure to improve the sidewall profile of the floating gate. However, the use of etching gases to achieve profile control may result in damage to the hard mask of the thick oxide with bird's beaks, reducing reliability of the memory devices.

Another conventional method for etching profile controlling is to control the process power. However, power control may lower the bombarding effect during etching, increasing the etching time.

SUMMARY

Accordingly, it is an object of the present invention to provide a novel semiconductor process for controlling etching profile, which employs an additional cleaning process to remove the polymer deposited over the inner wall of the plasma chamber during etching, thereby etching the silicon layer with excellent profile control.

It is another object of the present invention to provide a novel method of forming floating gates for flash memory devices, which employs an additional cleaning process to remove the polymer deposited over the inner wall of the plasma chamber during forming the floating gate of the flash memory device by etching, thereby preventing lateral etching effect, to form the floating gate with an excellent etching profile and without damaging the hard mask.

According to the object of the present invention, the present invention provides a semiconductor process for controlling an etching profile. A plurality of substrates is provided, in which a silicon film and an overlying masking pattern layer are provided overlying each substrate. Each of the silicon films are etched in sequence in a plasma chamber using the masking pattern layer as an etch mask, a polymer layer being deposited over the inner wall of the plasma chamber during the etching. A cleaning process is performed in the plasma chamber between the etchings before the deposited polymer layer reaches such a degree as to induce lateral etching on the next film to be etched.

Moreover, the cleaning process preferably comprises the steps of using $O_2$, $Cl_2$, and $SF_6$ as a first cleaning gas to perform the process for about 30 sec and using $Cl_2$, and HBr as a second cleaning gas to perform the process for about 50 sec.

According to another object of the present invention, the present invention provides a method of forming floating gates for flash memory devices. A plurality of substrates is provided. A floating gate dielectric layer and a polysilicon layer are successively formed overlying each of the substrates. A capping layer with a bird's beak is formed overlying the polysilicon layer. Each of the polysilicon layers is etched using the overlying capping layer as an etch mask in sequence in a plasma chamber to form a floating gate on each of the floating gate dielectric layers, a polymer layer being deposited over the inner wall of the plasma chamber during the etching. A cleaning process is performed in the plasma chamber between the etchings before the deposited polymer layer reaches such a degree as to induce lateral etching on the next polysilicon layer.

Moreover, the cleaning process preferably comprises the steps of using $O_2$, $Cl_2$, and $SF_6$ as a first cleaning gas to perform the process for about 30 sec and using $Cl_2$, and HBr as a second cleaning gas to perform the process for about 50 sec.

According to yet another object of the present invention, the present invention provides a method of forming floating gates for flash memory devices. A plurality of substrates is provided. A floating gate oxide layer and a polysilicon layer are successively formed overlying each of the substrates. A thick oxide layer with a bird's beak is formed overlying the polysilicon layer. Each of the polysilicon layers is etched using the overlying thick oxide layer as an etch mask in sequence in a cleaned plasma chamber to form a floating gate on each of the floating gate oxide layers, a polymer layer being deposited over the inner wall of the plasma chamber during the etching. A cleaning process is performed in the plasma chamber between each of the etchings to remove the deposited polymer layer.

Moreover, the cleaning process preferably comprises the steps of using $O_2$, $Cl_2$, and $SF_6$ as a first cleaning gas to perform the process for about 30 sec and using $Cl_2$, and HBr as a second cleaning gas to perform the process for about 50 sec.

BRIEF DESCRIPTION OF THE DRAWINGS

The aforementioned objects, features and advantages of this invention will become apparent by referring to the following detailed description of the preferred embodiment with reference to the accompanying drawings, wherein.

DESCRIPTION

Figure 3:
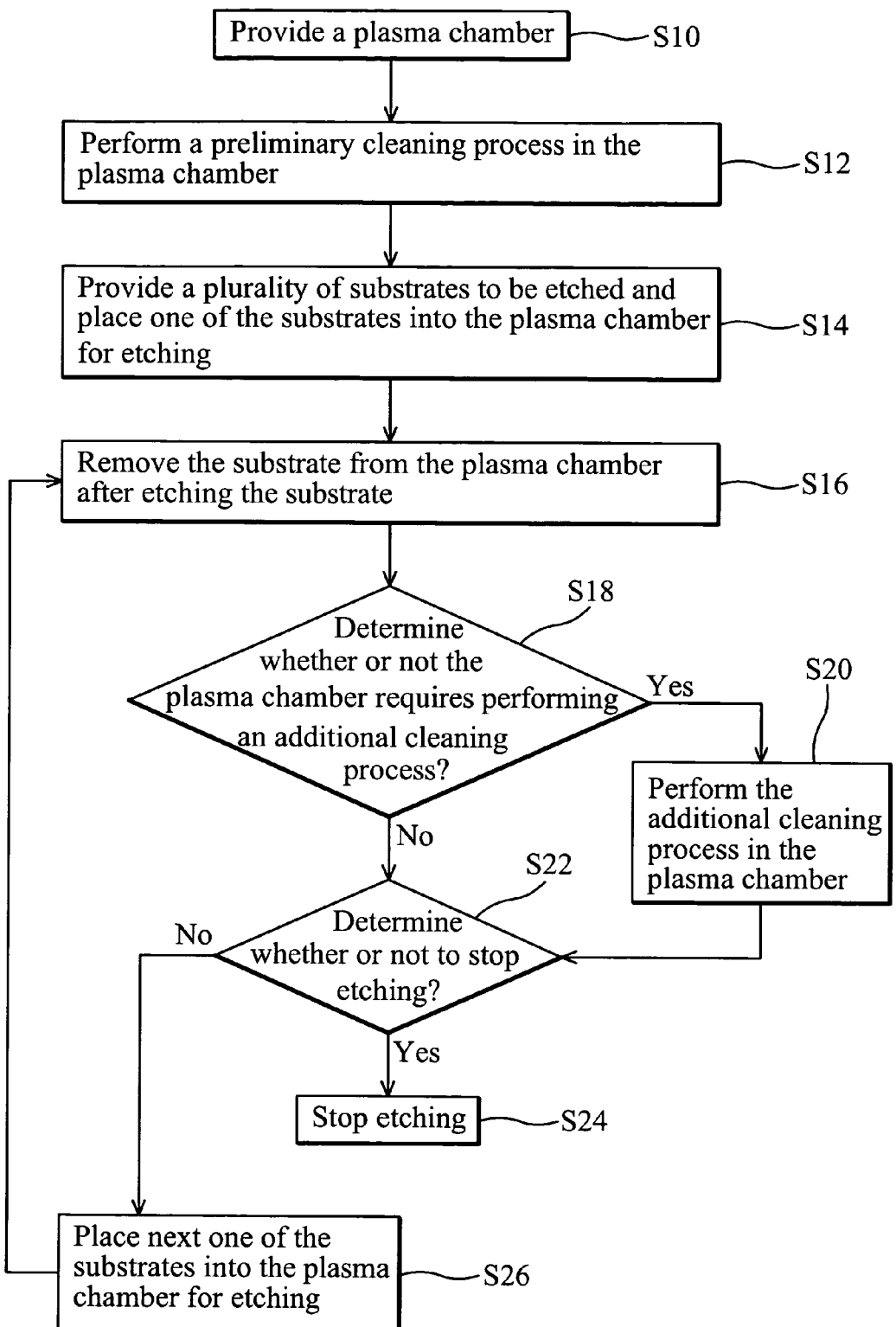
FIG. 3 is a flowchart showing a method for controlling the etching profile in the fabrication of a transistor gate and the fabrication of a floating gate for the split gate type flash memory, respectively, according to the invention.

Please refer to FIGS. 1a to 1d and FIG. 3, in which FIGS. 1a to 1d are cross-sections showing a method of forming a gate of transistor and FIG. 3 is a flowchart showing a method for controlling etching profile in the fabrication of a transistor gate.

First, in step S10, a plasma chamber, such as an etching chamber, is provided.

Next, in step S12, a preliminary cleaning process can optionally be performed in the plasma chamber before processing to expose the clean silicon containing inner wall of the plasma chamber. Here, the preliminary cleaning process is performed for about 8 to 12 minutes, where 10 minutes is preferable. In the invention, the preliminary cleaning process preferably includes four steps as follows. In the first step, $O_2$, $Cl_2$, and $SF_6$ are used as a first cleaning gas for about 70 seconds. The flow rates of $O_2$, $Cl_2$, and $SF_6$ are about 20 sccm, 20 sccm, and 150 sccm, respectively. Moreover, the process pressure and power in this step are about 15 mTorr and 800 W, respectively. In the second step, $O_2$, $Cl_2$, and He are used as a second cleaning gas for about 200 seconds. The flow rates of $O_2$, $Cl_2$, and He are about 50 sccm, 200 sccm, and 200 sccm, respectively. In the third step, $Cl_2$ and HBr are used as a third cleaning gas for about 150 seconds. The flow rates of $Cl_2$ and HBr are about 130 sccm, and 130 sccm, respectively. Moreover, the process pressure and power in this step are about 10 mTorr and 800 W, respectively. In the fourth step, He is used as a fourth cleaning gas for about 30 seconds. The flow rate of He is about 200 sccm. Moreover, the process pressure in this step is about 10 mTorr.

Figure 1A:
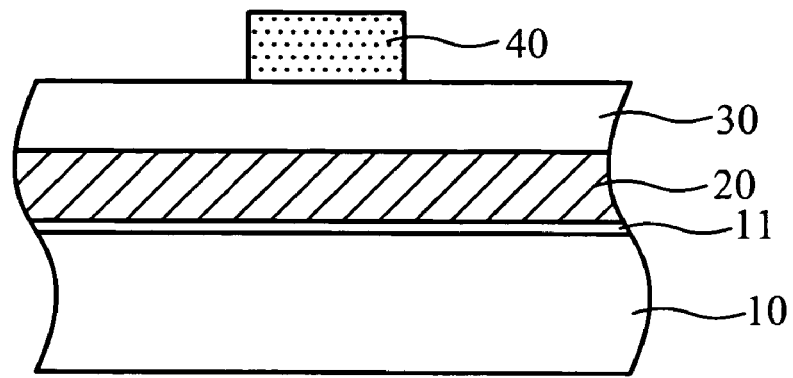
FIGS. 1a to 1d are cross-sections showing a method of forming a gate of transistor according to the invention.
Figure 1B:
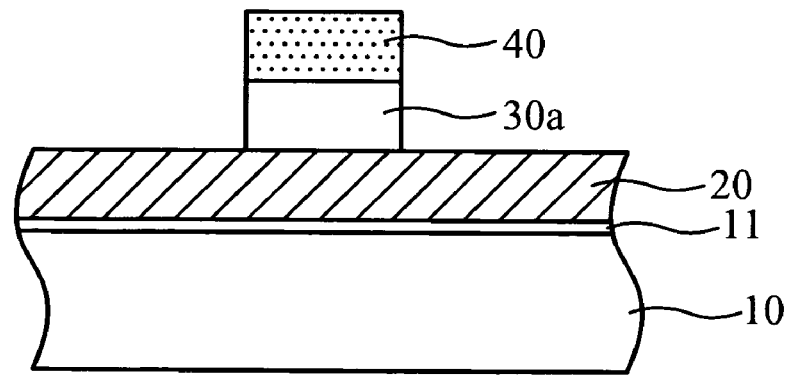
Figure 1C:
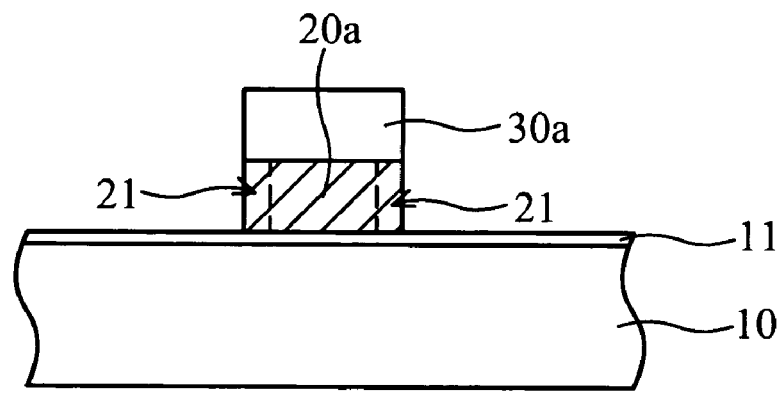

Next, in step S14, a plurality of substrates to be etched is provided. FIGS. 1a to 1b are cross-sections showing fabrication steps for one of such provided substrates. In FIG. 1a, a substrate 100, such a silicon wafer, is provided. Next, a gate dielectric layer 11, such as oxide, is formed on the substrate 100 by, for example, thermal oxidation. A layer to be etched 20, such as a doped silicon layer, is subsequently deposited on the gate dielectric layer 11 by conventional CVD. A masking layer 30, such as a thick silicon oxide layer, is deposited on the layer 20 by conventional CVD or thermal oxidation. Next, a photoresist layer 40 is formed by lithography and partially covers the masking layer 30. Thereafter, in the FIG. 1b, the masking layer 30 uncovered by the photoresist layer 40 is removed to leave a portion of the masking layer 30a serving as a hard mask for subsequent etching. After the photoresist layer 40 is removed, the provided substrate 10 is completed and subsequently placed into the plasma chamber for etching. In FIG. 1c, the layer 20 is etched using the masking layer 30a as an etch mask to leave a portion of the layer 20a serving as the gate of a transistor. During the etching, a polymer layer may be deposited over the inner wall of the plasma chamber.

Next, in step S16, the substrate 10 is removed from the plasma chamber after the etching is completed.

Figure 5A:
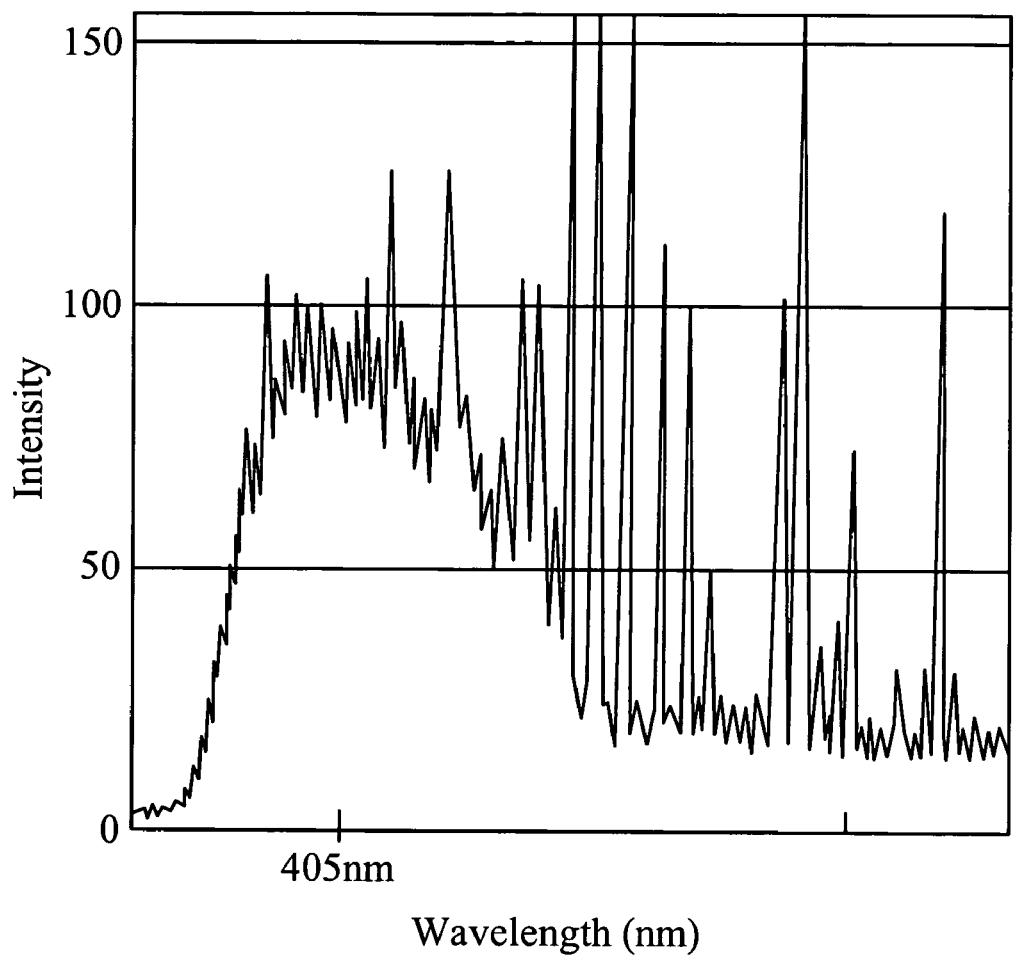
FIG. 5a illustrates an optical emission spectrum during etching a silicon layer in a chamber and shows the spectral intensity of a wavelength (405 nm) corresponding to silicon according to the invention.

Next, in step S18, the operator determines whether or not the plasma chamber requires performing an additional cleaning process. Here, the additional cleaning process is performed in the plasma chamber before the deposited polymer layer reaches such a degree as to induce lateral etching on the layer 20 of the next substrate 10, resulting in losing a portion of the gate 20a, as the dotted line regions 21 depicts in FIG. 1c. In the invention, the optical emission spectroscopy (OES) data analysis may be used to determine performing the additional cleaning process or not. OES is a process by which light emitted by a process, such as plasma within a reaction chamber, is analyzed to see which wavelengths are present in the light. Inference about the process may then be drawn as a result of the intensity (as a function of wavelength) of the various spectral lines present in the light. Accordingly, the presence of certain species within the chamber and the species content may be ascertained. That is, in the invention, OES may be used to detect silicon content within the plasma from etching a silicon film, so as to determine whether or not the plasma chamber requires performing an additional cleaning process. For example, the additional cleaning process is performed before the deposited polymer layer leads to a spectral intensity associated with the layer 20 from OES data analysis more than 100 at a wavelength about 405 nm (corresponding to silicon), as shown in FIG. 5a.

Step S20 proceeds with performing the additional cleaning process for 1 to 3 minutes and preferably 2 minutes if the chamber requires cleaning, thereby exposing the clean silicon containing inner wall of the plasma chamber. In the invention, the additional cleaning process preferably includes two steps as follows. In the first step, $O_2$, $Cl_2$, and $SF_6$ are used as a first cleaning gas to perform the additional cleaning process for about 30 seconds. The flow rates of $O_2$, $Cl_2$, and $SF_6$ are about 20 sccm, 20 sccm, and 150 sccm, respectively. Moreover, the process pressure and power in this step are about 15 mTorr and 800 W, respectively. In the second step, $Cl_2$, and HBr are used as a second cleaning gas to perform the additional cleaning process for about 50 seconds. The flow rates of $Cl_2$ and HBr are about 130 sccm, and 130 sccm, respectively.

In step S22, if the chamber does not require cleaning or the additional cleaning process is completed, the operator further determines whether or not to stop etching.

In step S24, etching is terminated. To the contrary, in step S26, the next of the provided substrates 100 is placed into the plasma chamber for etching, and then method returns to the step S16.

In one preferred embodiment of the invention, the additional cleaning process can be performed between each of the etchings during placing the plurality of the substrates 10 into the plasma chamber in sequence for etching.

Figure 1D:
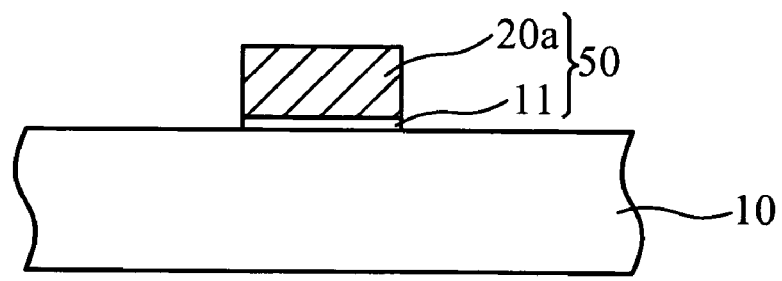

In FIG. 1d, after the gate 20a is formed by etching and the substrate removed from the plasma chamber, the masking layer, which is no longer needed, is removed. Next, the gate dielectric layer 11 is removed except for the portion underlying the gate 20a.

Figure 5B:
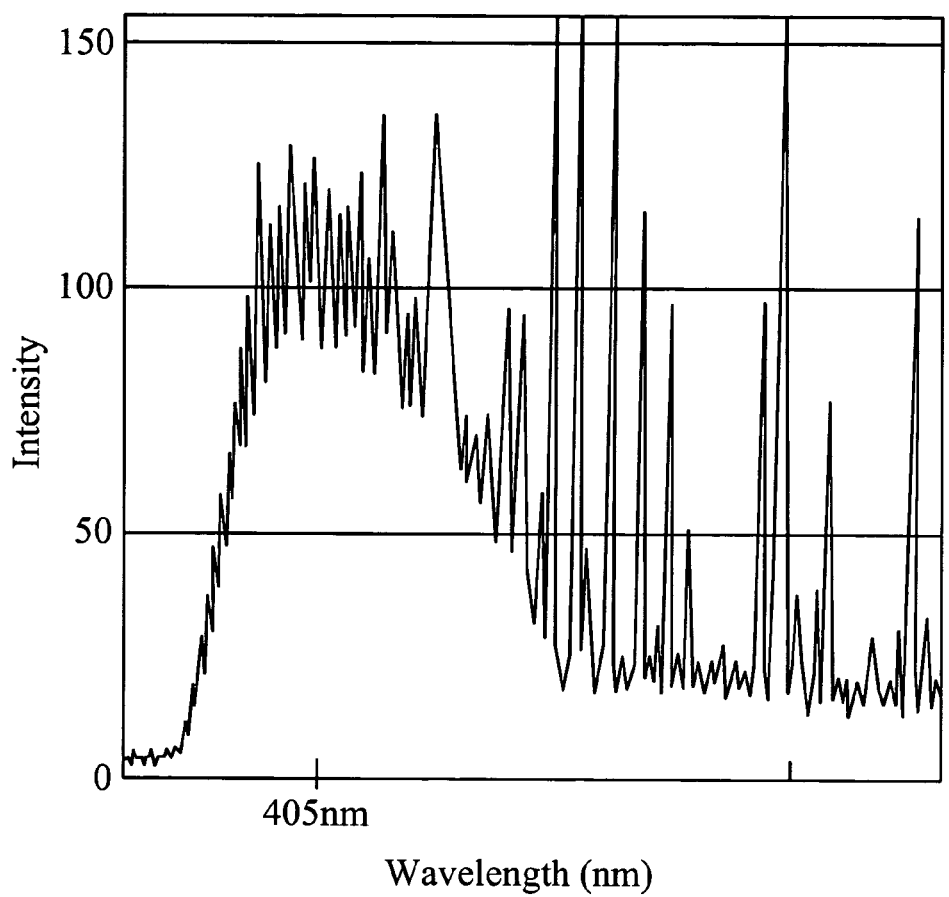
FIG. 5b illustrates an optical emission spectrum during etching a silicon layer in a chamber without additional cleaning and shows the spectral intensity of a wavelength (405 nm) corresponding to silicon according to the related art.

In the related art, the silicon containing inner wall of the plasma chamber without the additional cleaning is covered by a polymer layer after each etching. In this situation, the spectral intensity associated with the layer to be etched from OES data analysis is more than 100 at a wavelength about 405 nm (corresponding to silicon), as shown in FIG. 5b, resulting in a higher plasma density during etching and enhancing the lateral etching effect due to a stronger chemical reaction with the sidewall of the gate. To the contrary, since the exposed silicon on the inner wall of the plasma chamber is also etched by plasma during etching for gate fabrication according to the method of the present invention, the plasma density is relatively lower. In this situation, the a spectral intensity associated with the layer to be etched from OES data analysis is less than 100 at a wavelength about 405 nm (corresponding to silicon), as shown in FIG. 5a, preventing the lateral etching effect due to a relatively weaker chemical reaction with the sidewall of the gate. Accordingly, the etching profile of the gate can be improved. Moreover, since the etching gas and process power do need to be changed, the problems in the related art can be avoided.

Please refer to FIGS. 2a to 2f and FIG. 3, in which FIGS. 2a to 2f are cross-sections showing a method of forming a split gate type flash memory structure and FIG. 3 is a flowchart showing a method for controlling etching profile in the fabrication of a floating gate for the split gate type flash memory.

First, in step S10, a plasma chamber, such as an etching chamber, is provided.

Next, in step S12, a preliminary cleaning process can optionally be performed in the plasma chamber before processing to expose the clean silicon containing inner wall of the plasma chamber. Here, the preliminary cleaning process is performed for about 8 to 12 minutes, and 10 minutes is preferable. In the invention, the preliminary cleaning process preferably includes four steps as mentioned above.

Figure 2A:
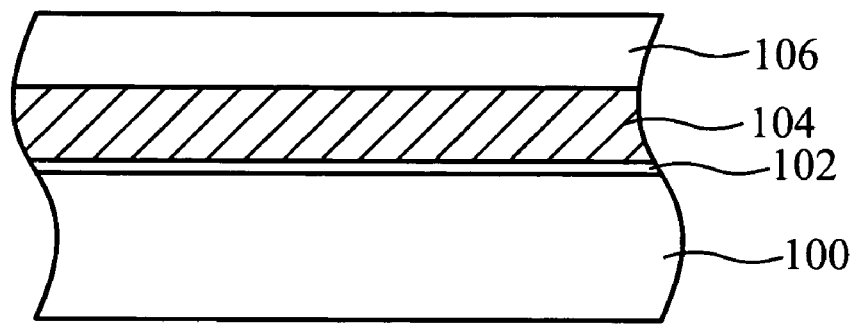
FIGS. 2a to 2f are cross-sections showing a method of forming a split gate type flash memory structure according to the invention.

Next, in step S14, a plurality of substrates to be etched is provided. FIGS. 2a to 2d are cross-sections showing fabrication steps for one of such provided substrates. In FIG. 2a, a gate dielectric layer 102, a first conductive layer 104, and a silicon nitride layer 106 are successively deposited overlying a substrate 100, such as a silicon wafer. The gate dielectric layer 102, such as a silicon oxide layer, can be formed by thermal oxidation. The first conductive layer 104, such as a doped polysilicon layer, and the silicon nitride layer 106 can be deposited by conventional deposition such as CVD, respectively.

Figure 2B:
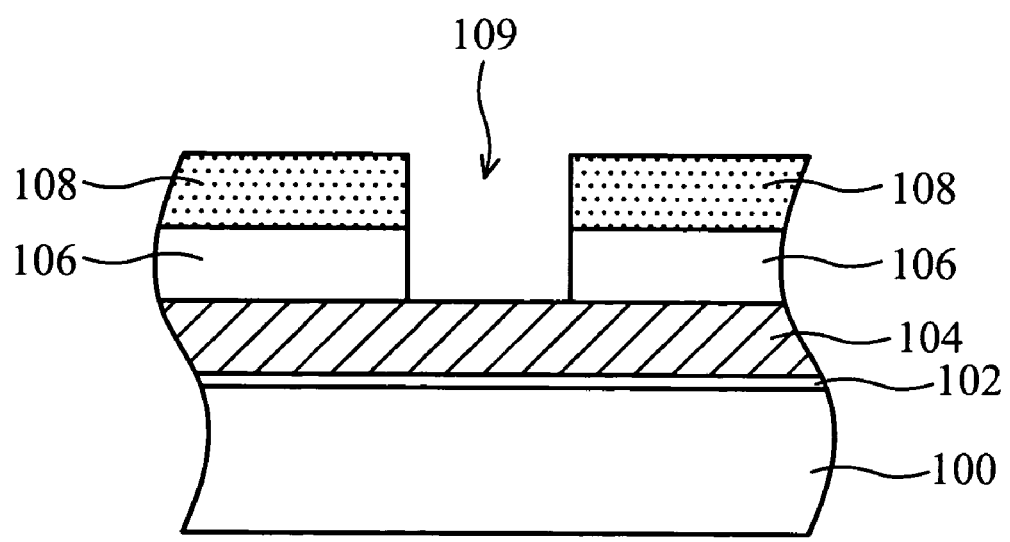

In FIG. 2b, a photoresist layer 108 with a floating gate pattern is formed on the silicon nitride layer 106. Thereafter, the silicon nitride layer 106 uncovered by the photoresist layer 108 is removed to form an opening 109 therein and expose a portion of the first conductive layer 104.

Figure 2C:
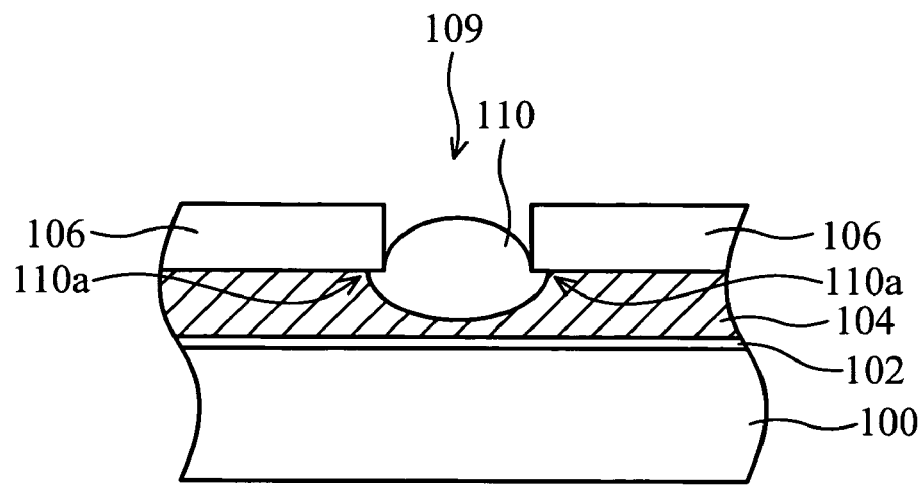
Figure 2D:
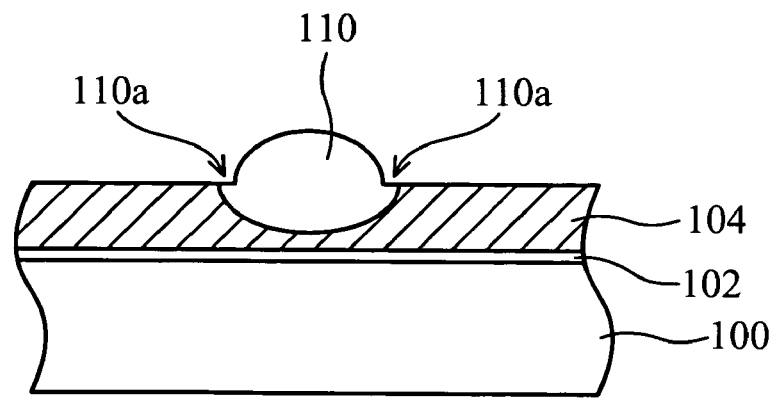

In FIG. 2c, the photoresist layer is removed. A thick capping layer 110 with bird's beaks 110a, such as a silicon oxide layer is subsequently formed on the exposed first conductive layer 104 in the opening 109 to serve as a hard mask for subsequent etching. Thereafter, the silicon nitride layer 106 is removed to expose the first conductive layer 104 uncovered by the capping layer 110 with bird's beaks 110a, as shown in FIG. 2d, and the provided substrate 100 is then completed. The provided substrate 100 is subsequently placed into the plasma chamber for etching.

Figure 2E:
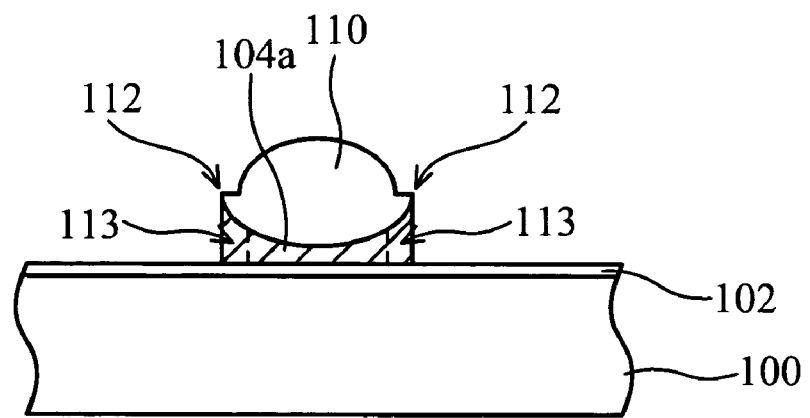

In FIG. 2e, the capping layer 110 is used as a hard mask to remove the exposed first conductive layer 104, thereby forming the floating gate 104a with tip portions at the upper corners 112. During the etching, a polymer layer may be deposited over the inner wall of the plasma chamber.

Next, in step S16, the substrate 100 is removed from the plasma chamber after the substrate to be etched is completed.

Next, in step S18, the operator determines whether or not the plasma chamber requires performing an additional cleaning process. Here, the additional cleaning process is performed in the plasma chamber before the deposited polymer layer reaches such a degree as to induce lateral etching on the conductive layer 104 of the next substrate 100, resulting in losing a portion of the floating gate 104a, as the dotted-line regions 113 depicts in FIG. 2e, and rounding the corner 112 off. For example, the additional cleaning process is performed before the deposited polymer layer leads to a spectral intensity associated with the first conductive layer 104 from OES data analysis more than 100 at a wavelength about 405 nm (corresponding to silicon), as shown in FIG. 5a.

Step S20 proceeds with performing the additional cleaning process for 1 to 3 minutes and preferably 2 minutes if the chamber requires cleaning, thereby exposing the clean silicon containing inner wall of the plasma chamber. In the invention, the additional cleaning process includes two steps as mentioned above.

In step S22, if the chamber does not require cleaning or the additional cleaning process is completed, the operator further determines whether or not to stop etching.

In step S24, etching is over. To the contrary, in step S26, the next of the provided substrates 100 is placed into the plasma chamber for etching and the method returns to the step S16.

In a preferred embodiment of the invention, the additional cleaning process can be performed between each of the etchings during placing the plurality of the substrates 100 into the plasma chamber in sequence for etching.

Figure 2F:
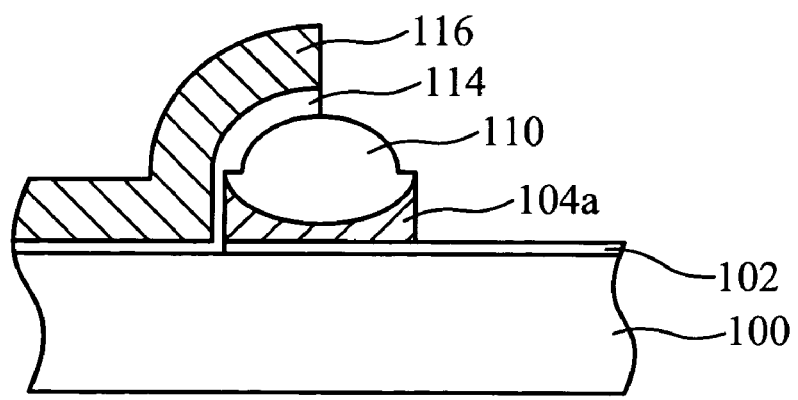

In FIG. 2f, an inter-poly oxide layer 114 and a second conductive layer 116, such as a doped polysilicon layer, serving as a control gate are successively form at one side of the floating gate 104a and cover a portion of the capping layer 110 to complete the split gate type flash memory structure.

In the related art, the silicon containing inner wall of the plasma chamber without the additional cleaning is covered by a polymer layer after each etching. In this situation, the spectral intensity associated with the layer to be etched from OES data analysis is more than 100 at a wavelength about 405 nm (corresponding to silicon), as shown in FIG. 5b, resulting in a higher plasma density during etching and enhancing the lateral etching effect due to a stronger chemical reaction with the sidewall of the floating gate. To the contrary, since the exposed silicon on the inner wall of the plasma chamber is also etched by plasma during etching for floating gate fabrication in the method of the present invention, the plasma density is relatively lower. In this situation, the spectral intensity associated with the layer to be etched from OES data analysis is less than 100 at a wavelength about 405 nm (corresponding to silicon), as shown in FIG. 5a, preventing lateral etching effect due to a relatively weaker chemical reaction with the sidewall of the floating gate. Accordingly, the etching profile of the gate can be improved, thus increasing the erase performance of the flash memory devices. Moreover, since the etching gas and process power do need to be changed, the problems in the related art can be avoided.

Figure 4:
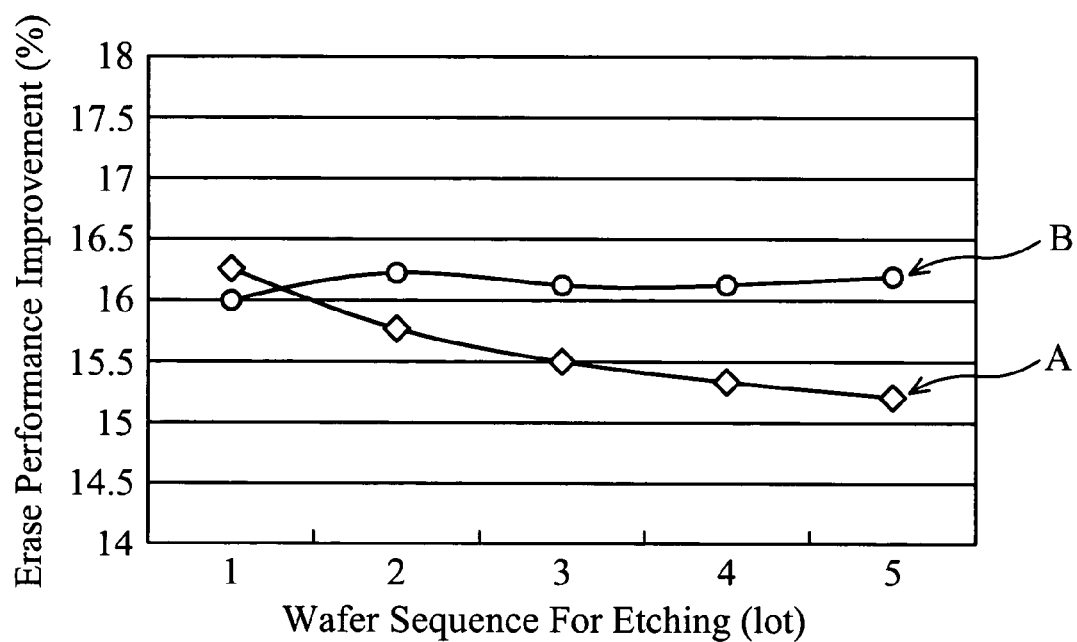
FIG. 4 is a diagram of the relationship between the erase performance improvement (%) and the wafer sequence for etching (lot).

FIG. 4 is a diagram showing the relationship between the erase performance improvement (%) and the wafer sequence for etching (lot). In FIG. 4, curve "A" depicts the situation in which the plasma chamber is not subjected to the additional cleaning process and curve "B" depicts the situation in which plasma chamber is subjected to the additional cleaning process according to the present invention. As shown in FIG. 4, the erase performance decreases as the number of the wafers etched increases if the plasma chamber is not subjected to the additional cleaning process. On the contrary, a substantially constant erase performance can be obtained if the plasma chamber is subjected to the additional cleaning process.

While the invention has been described by way of example and in-terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor process for controlling etching profile, comprising the steps of:
   providing a plurality of substrates, wherein each substrate comprises a film to be etched and an overlying masking pattern layer thereon; and
   etching the film to be etched on each substrate in a plasma chamber using the masking pattern layer as an etch mask, a polymer layer being deposited over the inner wall of the plasma chamber during the etching;
   wherein an intermediary cleaning process is performed in the plasma chamber between the etchings before the deposited polymer layer reaches such a degree as to induce lateral etching on the film to be etched of the next substrate, wherein the intermediary cleaning process is performed for 1~3 minutes, and wherein the intermediary cleaning process further comprises the steps of:
   using $O_2$, $Cl_2$, and $SF_6$ as a first cleaning as for about 30 sec; and
   using $Cl_2$, and HBr as a second cleaning gas for about 50 sec.

2. The semiconductor process of claim 1, wherein the film to be etched is a silicon layer.

3. The semiconductor process of claim 2, wherein the intermediary cleaning process is performed before the deposited polymer layer leads to a spectral intensity associated with the layer to be etched from OES data analysis more than 100 at a wavelength about 405 nm.

4. The semiconductor process of claim 1, wherein the mask layer is a silicon oxide layer.

5. The semiconductor process of claim 1, wherein the intermediary cleaning process is performed between each of the etchings.

6. The semiconductor process of claim 1, further comprising performing a preliminary cleaning process in the plasma chamber before placing the substrates therein.

7. The semiconductor process of claim 6, wherein the preliminary cleaning process is performed for 8~12 minutes.

8. The semiconductor process of claim 7, wherein the preliminary cleaning process further comprises the steps of:
   using $O_2$, $Cl_2$, and $SF_6$ as a first cleaning gas for about 70 sec;
   using $O_2$, $Cl_2$, and He as a second cleaning gas for about 200 sec;
   using $Cl_2$, and HBr as a third cleaning gas for about 150 sec; and
   using He as a fourth cleaning gas for about 30 sec.

9. A method of forming floating gates for flash memory devices, comprising the steps of:
   providing a plurality of substrates;
   successively forming a floating gate dielectric layer and a polysilicon layer overlying each of the substrates;
   forming a capping layer with a bird's beak overlying the polysilicon layer; and
   etching each of the polysilicon layers in sequence in a plasma chamber using the overlying capping layer as an etch mask to form a floating gate on each of the floating gate dielectric layers, a polymer layer being deposited over the inner wall of the plasma chamber during the etching;
   wherein an intermediary cleaning process is performed in the plasma chamber between the etchings before the deposited polymer layer reaches such a degree as to induce lateral etching on the next polysilicon layer.

10. The method of claim 9, wherein the intermediary cleaning process is performed between each of the etchings.

11. The method of claim 9, the intermediary cleaning process is performed for 1~3 minutes.

12. The method of claim 11, wherein the intermediary cleaning process further comprises the steps of:
    using $O_2$, $Cl_2$, and $SF_6$ as a first cleaning gas to perform the for about 30 sec; and
    using $Cl_2$, and HBr as a second cleaning gas to perform the for about 50 sec.

13. The method of claim 9, further comprising performing a preliminary cleaning process in the plasma chamber before placing the substrates therein.

14. The method of claim 13, wherein the preliminary cleaning process is performed for 8~12 minutes.

15. The method of claim 14, wherein the preliminary cleaning process further comprises the steps of:
    using $O_2$, $Cl_2$, and $SF_6$ as a first cleaning gas for about 70 sec;
    using $O_2$, $Cl_2$, and He as a second cleaning gas for about 200 sec;
    using $Cl_2$, and HBr as a third cleaning gas for about 150 sec; and
    using He as a fourth cleaning gas for about 30 sec.

16. The method of claim 9, wherein the intermediary cleaning process is performed before the deposited polymer layer leads to a spectral intensity associated with the polysilicon layer from OES data analysis more than 100 at a wavelength about 405 nm.

17. The method of claim 9, wherein the floating gate dielectric layer is a silicon oxide layer.

18. The method of claim 9, wherein the capping layer is silicon oxide layer.

19. A method of forming floating gates for flash memory devices, comprising the steps of:
    providing a plurality of substrates;
    successively forming a floating gate oxide layer and a polysilicon layer overlying each of the substrates;
    forming a oxide layer with a bird's beak overlying the polysilicon layer; and
    etching each of the polysilicon layers in sequence in a cleaned plasma chamber using the overlying oxide layer as an etch mask to form a floating gate on each of the floating gate oxide layers, a polymer layer being deposited over the inner wall of the plasma chamber during the etching;

wherein a cleaning process is performed in the plasma chamber between each of the etchings to remove the deposited polymer layer.

20. The method of claim 19, wherein the cleaning process is performed for 1~3 minutes.

21. The method of claim 20, wherein the cleaning process further comprises the steps of:

using $O_2$, $Cl_2$, and $SF_6$ as a first cleaning gas for about 30 sec; and using $Cl_2$, and HBr as a second cleaning gas for about 50 sec.

* * * * *